US009312805B2

(12) United States Patent
Gustafson

(10) Patent No.: US 9,312,805 B2
(45) Date of Patent: Apr. 12, 2016

(54) SYSTEMS AND METHODS FOR CONCENTRATED SOLAR PHOTOVOLTAIC POWER GENERATION WITH CONTROLLABLE RADIATION ATTENUATION

(76) Inventor: Vincent K. Gustafson, Chapel Hill, NC (US)

( * ) Notice: Subject to any disclaimer, the term of this patent is extended or adjusted under 35 U.S.C. 154(b) by 1014 days.

(21) Appl. No.: 13/143,191

(22) PCT Filed: Dec. 31, 2009

(86) PCT No.: PCT/US2009/069883
§ 371 (c)(1),
(2), (4) Date: Jul. 3, 2011

(87) PCT Pub. No.: WO2010/078473
PCT Pub. Date: Jul. 8, 2010

(65) Prior Publication Data
US 2011/0265872 A1 Nov. 3, 2011

Related U.S. Application Data

(60) Provisional application No. 61/142,378, filed on Jan. 5, 2009.

(51) Int. Cl.
*H01J 3/14* (2006.01)
*H01L 31/042* (2014.01)
(Continued)

(52) U.S. Cl.
CPC ............ *H02S 40/44* (2014.12); *H01L 31/0543* (2014.12); *G01J 1/0418* (2013.01); *Y02E 10/52* (2013.01); *Y02E 10/60* (2013.01)

(58) Field of Classification Search
CPC ............ G01J 2005/28; G01J 2005/283; G01J 2005/286; G01J 1/42; G01J 1/0418; G01J 1/0422; G02B 26/023; G02B 26/02; Y02B 10/20; Y02B 10/70; Y02E 10/40; Y02E 10/44; Y02E 10/50; H01L 27/146; H01L 31/042; H01L 31/0406; H01L 31/058; H01L 31/052; H01L 27/144

USPC ............ 250/216, 201.1, 208.2, 214 R, 214.1, 250/238, 203.1, 203.3, 203.4; 359/238, 359/288, 290, 294, 296, 297, 315, 316, 322, 359/484.08; 126/595, 593, 683, 684, 573, 126/701; 136/245, 252, 253, 254, 259, 257
See application file for complete search history.

(56) References Cited

U.S. PATENT DOCUMENTS 3,915,148 A 10/1975 Fletcher
4,023,088 A 5/1977 Fowler
(Continued)

FOREIGN PATENT DOCUMENTS

EP 1114284 B1 8/2003
EP 1521044 A2 4/2005
(Continued)

OTHER PUBLICATIONS

Andreev, Viacheslav, et al., "Effect of Nonuniform Light Intensity Distribution on Temperature Coefficients of Concentrated Solar Cells," Jun. 2003; Proceedings of 3rd World Conference on Photovoltaic Energy Conversion, vol. 1.
(Continued)

*Primary Examiner* — Que T Le
*Assistant Examiner* — Jennifer Bennett
(74) *Attorney, Agent, or Firm* — Vincent K. Gustafson

(57) ABSTRACT

In a concentrated solar photoelectric system, at least one controllable radiation attenuation element (e.g., an array of controllable pixels or segments) is arranged to selectively attenuate transmission of radiation to a photoelectric element (e.g., a solar panel). Liquid crystals may provide attenuation utility without necessity for mechanical actuation. Attenuation may be controlled responsive to at least one sensor to maintain each portion of the photoelectric element at or below a maximum power conversion point. Non-planar attenuators and/or lenses may be provided. One or more thermal exchange fluid channels may be in thermal communication with the thermoelectric element.

20 Claims, 4 Drawing Sheets

(51) Int. Cl.
*H02S 40/44* (2014.01)
*H01L 31/054* (2014.01)
*G01J 1/04* (2006.01)

(56) References Cited

U.S. PATENT DOCUMENTS

| | | | |
|---|---|---|---|
| 4,083,356 A | 4/1978 | Rajagopal | |
| 4,210,121 A | 7/1980 | Stark | |
| 4,440,155 A | 4/1984 | Maloof | |
| 4,472,293 A | 9/1984 | Sugimori | |
| 4,700,013 A | 10/1987 | Soule | |
| 4,799,778 A | 1/1989 | Jebens | |
| 4,822,519 A | 4/1989 | Saito | |
| 5,289,998 A * | 3/1994 | Bingley et al. | 244/172.7 |
| 5,523,776 A | 6/1996 | Hougham | |
| 5,707,458 A | 1/1998 | Nagashima | |
| 5,868,962 A | 2/1999 | Rieger | |
| 5,932,029 A * | 8/1999 | Stone et al. | 136/253 |
| 5,958,290 A | 9/1999 | Coates | |
| 6,259,549 B1 | 7/2001 | Leupolz | |
| 6,612,705 B1 | 9/2003 | Davidson | |
| 6,647,166 B2 | 11/2003 | Richardson | |
| 6,653,551 B2 | 11/2003 | Chen | |
| 6,688,303 B2 | 2/2004 | Davenport | |
| 6,717,045 B2 | 4/2004 | Chen | |
| 6,827,445 B2 | 12/2004 | Abe | |
| 6,843,573 B2 | 1/2005 | Rabinowitz | |
| 6,864,473 B2 * | 3/2005 | Chretien et al. | 250/201.1 |
| 6,958,868 B1 | 10/2005 | Pender | |
| 6,959,520 B2 * | 11/2005 | Hartman | 52/838 |
| 6,964,486 B2 | 11/2005 | Rabinowitz | |
| 7,152,977 B2 | 12/2006 | Ruda | |
| 7,187,490 B2 | 3/2007 | Rabinowitz | |
| 7,368,655 B2 | 5/2008 | Blieske | |
| 7,973,236 B2 * | 7/2011 | Sinsabaugh | 136/246 |
| 2007/0012349 A1 * | 1/2007 | Gaudiana et al. | 136/244 |
| 2007/0107770 A1 | 5/2007 | Rust | |
| 2007/0152188 A1 | 7/2007 | Silverman | |
| 2007/0153354 A1 * | 7/2007 | Duston et al. | 359/245 |
| 2008/0060636 A1 | 3/2008 | Tuchelt | |
| 2008/0178867 A1 | 7/2008 | DiDomenico | |
| 2008/0295883 A1 | 12/2008 | Ducellier | |
| 2012/0038841 A1 * | 2/2012 | Taheri et al. | 349/25 |

FOREIGN PATENT DOCUMENTS

| | | |
|---|---|---|
| GB | 2320356 A | 12/1995 |
| JP | 57-002582 A | 1/1982 |
| JP | 62-115416 A | 5/1987 |
| JP | 2001-077389 A | 3/2001 |
| JP | 2002-289896 A | 10/2002 |
| WO | 2006/129104 A1 | 12/2006 |
| WO | 2007/143517 A2 | 12/2007 |

OTHER PUBLICATIONS

Lee, Hsien-Che, "Introduction to Color Imaging Science," 2005, pp. 533-537, Cambridge University Press.

Khelifi, S., et al., "Effects of Temperature and Series Resistance on GaAs Concentrator Solar Cell," Feb. 6, 2008, Eur. Phys. J. Appl. Phys 41, pp. 115-119, EDP Sciences.

Barrett, G., "Light Transmission and Touch Panels," accessed online Dec. 27, 2008, Touch International Bulletin.

International Search Report dated Aug. 17, 2010 in International Patent Application No. PCT/US2009/069883.

Yates, T.A., "Solar Cells in Concentrating Systems and Their High Temperature Limitations," Sep. 3, 2003, Senior Thesis, Physics Department, University of California, Santa Cruz.

* cited by examiner

| A1 | B1 | C1 | D1 |
|----|----|----|----|
| A2 | B2 | C2 | D2 |
| A3 | B3 | C3 | D3 |
| A4 | B4 | C4 | D4 |
FIG._5
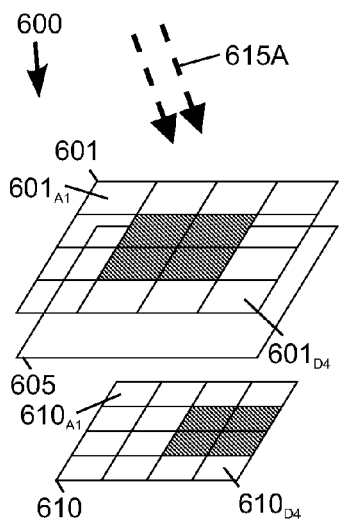
FIG._6A
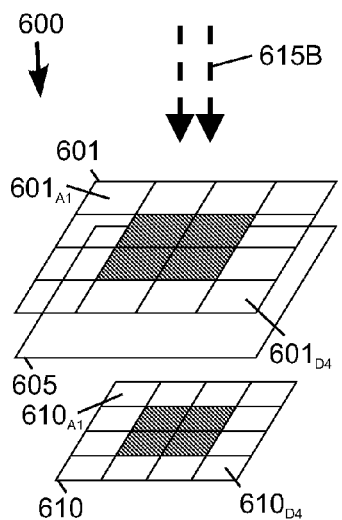
FIG._6B
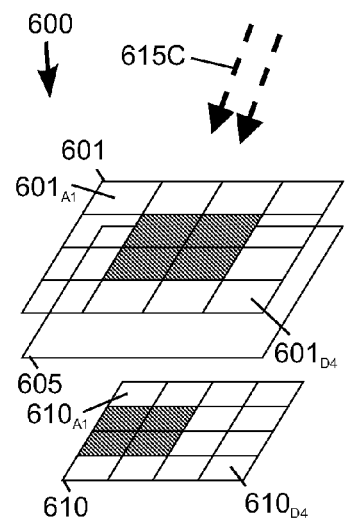
FIG._6C
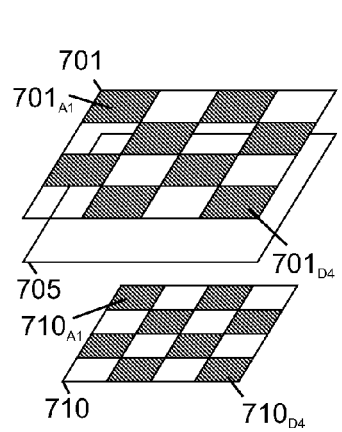
FIG._7A
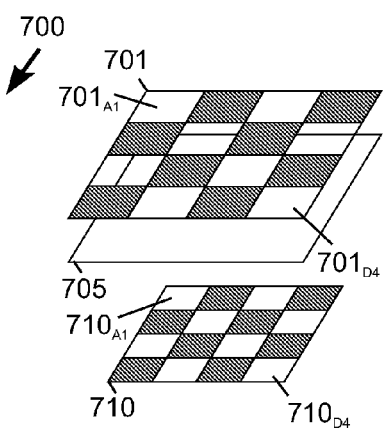
FIG._7B

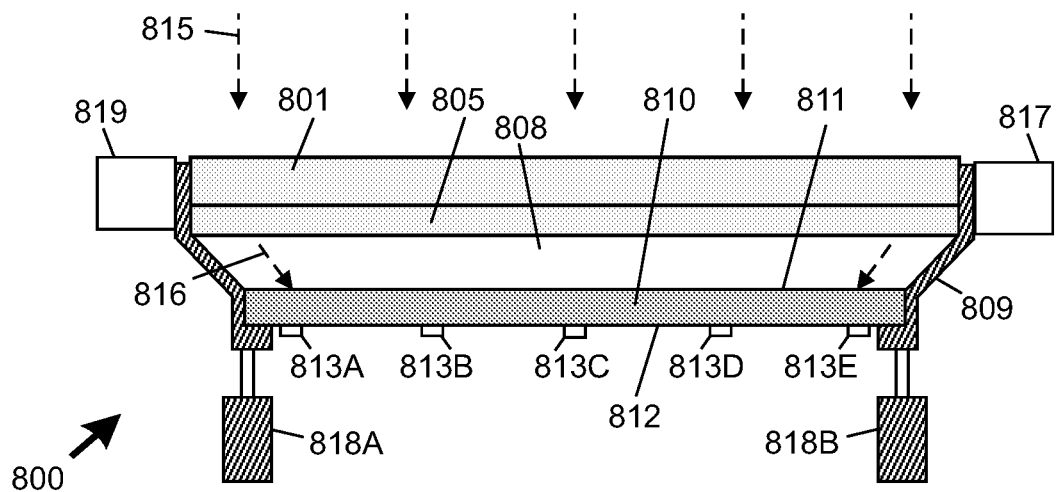
FIG._8
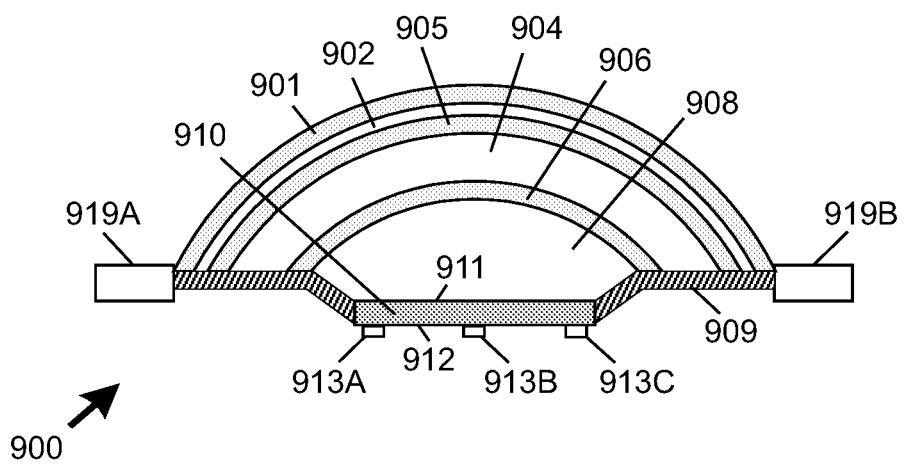
FIG._9 ially even distribution of concentrated solar radiation on a PV cell. That is, radiation may be more concentrated along one portion (e.g., center) of a solar cell than along another portion (e.g., edges), potentially resulting in decreased electrical output and uneven thermal loading across the surface of the cell. Additionally, useful life of a solar cell in a concentrated system may be reduced by extended operation at very high temperatures. It would be desirable to overcome these limitations.

Based on the foregoing, the art continues to seek improvements concentrated solar energy utilization systems.

SYSTEMS AND METHODS FOR CONCENTRATED SOLAR PHOTOVOLTAIC POWER GENERATION WITH CONTROLLABLE RADIATION ATTENUATION

CROSS-REFERENCE TO RELATED APPLICATION(S)

This application is a U.S. national phase application under the provisions of 35 U.S.C. §371 of International Patent Application No. PCT/US09/69883 filed on Dec. 31, 2009, which in turn claims priority to and benefit of U.S. Provisional Patent Application No. 61/142,378 filed on Jan. 5, 2009. The disclosures of such international patent application and U.S. patent application are hereby incorporated by reference herein in their respective entireties, for all purposes.

FIELD OF THE INVENTION

The present invention relates to solar concentration systems and the utilization of solar energy for various desirable end uses, preferably including electric power generation.

BACKGROUND

Due to resource attrition and pollution, there exists a need to supplant conventional carbon-based energy sources such as coal, oil, and natural gas with renewable sources such as solar energy. A limiting factor in the utilization of solar energy is the high cost of energy converters such as solar cells (e.g., photoelectric elements such as photovoltaic ("PV") cells). Another limiting factor in the utilization of solar energy is the uneven availability of incident solar radiation (illumination) from one season to another, one day to another, and even within a day (e.g., due to variation in weather). Illumination also varies dramatically with respect to latitude. It would be desirable to maximize output and reliability of PV cell-based systems over a wide range of illumination conditions.

Two basic approaches for enhancing output of PV systems include (A) improving efficiency of solar cells; and (B) concentrating incident radiation (e.g., using lenses, mirrors, parabolic dishes, or other optics—often including a mechanism to track the path of the sun during the day. PV efficiency is limited (e.g., silicon-based PV cells may have maximum theoretical efficiency of ~29%), PV cell efficiency declines with increasing temperature, and highly efficient PV cells are expensive. Solar concentrators deliver increased radiation to solar cells, enabling greater power output from a given number of cells, typically at a lower cost than simply deploying more cells not subject to concentration. Depending on the concentrating elements used, incident radiation may be concentrated only slightly, or greatly—e.g., to a factor of 1000 or more (e.g., as described in U.S. Pat. No. 6,717,045, which is hereby incorporated by reference).

One advantage of highly concentrated PV systems is that they enable generation of substantial power early and late in the day, when illumination intensity is low. Such systems, however, may transmit too much radiation to PV cells at mid-day when illumination is at its maximum, and require specialized cooling systems to transfer excess heat away from the solar cell. Such cooling systems may be expensive to construct or operate, may require frequent maintenance, may degrade in efficiency, and/or may have slow transient response. Moreover, failure of a cooling system in a highly concentrated system may reduce useful life of a PV cell life. It would be desirable to overcome these limitations.

A solar concentrator typically utilizes a fixed concentrating element, and exhibits a fixed concentration factor. Providing concentrators with optimal concentration factors for different locations and/or times of year may be difficult, as higher concentration factors may be appropriate for locales and periods receiving low average or peak illumination intensity (e.g., latitudes closer to the poles, winter season in the northern hemisphere, etc.) versus locales and periods characterized by greater average or peak illumination. While moveable optical components (i.e., moveable relative to a PV cell) could be employed to alter concentration factor, addition of moving parts would increase cost, increase maintenance requirements, and may compromise reliability by introducing additional failure modes. It would be desirable to obtain the benefits of highly concentrated PV systems during low to moderate illumination conditions, and avoid drawbacks of excess concentration during high illumination conditions, without requiring relative movement between optical components and a PV cell. It would be further desirable to standardize a solar concentrator without requiring different concentration factors for different locations and periods.

Up to a limit, an increase in illumination on a PV cell causes an increase in converted power. There is a point, however, at which efficiency of the cell becomes so poor due to rise in temperature that any increase in illumination causes a decrease in converted power. The point at which this occurs ("maximum power conversion point") represents the maximum power that a cell can convert. (See Yates, Tarn A., thesis entitled "Solar cells in concentrating systems and their high temperature limitations," September 2003, available at http://quantum.soe.ucsc.edu/research/SolarCell/Tarn_Senior%20Thesis.pdf, hereby incorporated by reference.) It would be desirable to maintain a PV cell at (or not exceeding) its maximum power conversion point.

In some cases, solar concentrators fail to provide optim

SUMMARY OF THE INVENTION

The present invention relates to concentrated solar energy utilization systems, with various embodiments including a radiation attenuating element arranged to selectively attenuate transmission of radiation to at least a portion of a photoelectric element.

In one aspect, the invention relates to a solar energy utilization system comprising: a solar concentrating element; a photoelectric element arranged to receive radiation concentrated by the solar concentrating element; at least one sensor arranged to generate at least one output signal correlative of any of (A) temperature of at least one portion of the photoelectric element, (B) voltage of at least one portion of the photoelectric element, (C) current of at least one portion of the photoelectric element, and (D) incident or received solar radiation; and a primary radiation attenuating element arranged to selectively attenuate transmission of radiation to at least a portion of the photoelectric element responsive to the output signal.

In another aspect, the invention relates to a solar energy utilization system comprising: a solar concentrating element; a photoelectric element arranged to receive radiation concentrated by the solar concentrating element; a primary radiation attenuating element comprising an array of independently controllable segments or pixels arranged to selectively attenuate transmission of radiation to at least one portion of the photoelectric element; and a controller adapted to control the array of independently controllable segments or pixels.

In a further aspect, the invention relates to a method utilizing a solar concentrating element, a photoelectric element arranged to receive radiation concentrated by the solar concentrating element, and a primary radiation attenuating element arranged to selectively attenuate transmission of radiation to at least one portion of the photoelectric element, the method comprising: sensing and generating at least one output signal indicative of any of (A) temperature of at least one portion of the photoelectric element, (B) voltage of at least one portion of the photoelectric element, (C) current of at least one portion of the photoelectric element, and (D) incident or received solar radiation; and selectively attenuating transmission of radiation to at least a portion of the photoelectric element responsive to the at least one output signal.

A further aspect of the invention relates to a method utilizing a solar concentrating element, a photoelectric element having a plurality of portions arranged to receive radiation concentrated by the solar concentrating element, and a primary radiation attenuating element comprising an array of independently controllable segments or pixels arranged to selectively attenuate transmission of radiation to the plurality of portions, the method comprising: sensing an output or condition of each portion of the plurality of portions; controlling operation of the array of independently controllable segments or pixels to maintain each portion in any of the following conditions: (A) at or below a maximum temperature threshold, and (B) at or below a maximum power conversion point.

A still further aspect of the invention relates to a method utilizing a concentrated solar photoelectric apparatus including a solar concentrating element, a photoelectric element having a plurality of portions arranged to receive radiation concentrated by the solar concentrating element, and a primary radiation attenuating element comprising an array of independently controllable segments or pixels arranged to selectively attenuate transmission of radiation to the plurality of portions, the method comprising: mapping or correlating time-dependent operating relationships between (A) at least some controllable segments or pixels of the array of independently controllable segments or pixels and (B) at least some portions of the plurality of portions; and adjusting or controlling operation of the primary radiation attenuating element responsive to the mapping or correlating step.

In another aspect, any of the foregoing aspects may be combined for additional advantage. Other aspects, features and embodiments of the invention will be more fully apparent from the ensuing disclosure and appended claims.

BRIEF DESCRIPTION OF THE DRAWINGS

FIG. 5 is a schematic providing row and column addresses for sixteen segments of radiation attenuating elements and PV panels illustrated in FIGS. 6A-6C and 7A-7B.

FIGS. 6A-6C provide perspective schematic views of portions of a concentrated solar PV system according to one embodiment, showing relative correspondence or mapping between segments of a radiation attenuating element and segments of a PV panel for incident radiation at different angles corresponding to different periods of time.

FIGS. 7A-7B provide perspective views of a concentrated solar PV system according to one embodiment, showing two different attenuation patterns applied to a radiation attenuation element including sixteen segments.

FIG. 8 is a side cross-sectional view of a concentrated solar PV system including a radiation attenuating element and including a solar tracking apparatus arranged to adjust position of at least one element of the PV system, according to a further embodiment.

FIG. 9 is a side cross-sectional view of a concentrated solar PV system including a non-planar radiation attenuating element, according to a further embodiment.

DETAILED DESCRIPTION OF THE INVENTION AND PREFERRED EMBODIMENTS

Figure 1:
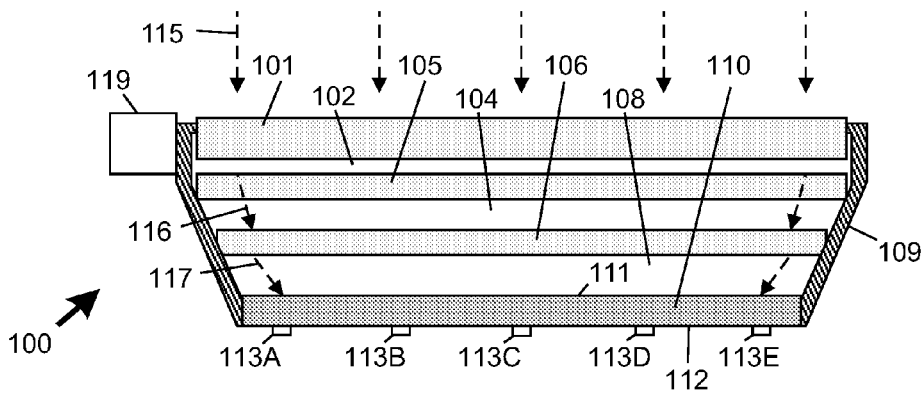
FIG. 1 is a side cross-sectional view of a concentrated solar PV system including a radiation attenuating element, according to a first embodiment.

The present invention relates in certain embodiments to solar concentration systems including at least one selectively controllable radiation attenuating element arranged to control delivery of radiation to at least one photoelectric (e.g., photovoltaic or PV) element. At least one sensor (preferably, multiple sensors) may be provided to generate at least one output signal indicative or correlative of at least one of: (A) temperature of at least a portion of a PV element; (B) voltage of at least a portion of a PV element; (C) current of at least a portion of a PV element; and (D) incident or received solar radiation. The radiation attenuating element may be arranged to selectively attenuate transmission of radiation to the at least one photoelectric element responsive to the at least one output signal. A photoelectric element may include multiple portions, and controllable operation of the radiation attenuation element permits each portion of the photoelectric element in a concentrated PV system to be maintained close to (preferably within 5%, more preferably within 2%), or at, its maximum power conversion point without exceeding same.

Various types of radiation attenuating ("RA") elements may be used. A RA element is desirably activated with one or more electrical signals and includes multiple addressable portions or segments that may be independent activated to selectively attenuate, reduce, or block transmission or radiation in one (e.g., activated) state, or selectively permit transmission of radiation in another (e.g., non-activated) state. Addressable portions or segments may correspond to pixels. As a concentrating element, such as a Fresnel lens or other lens, may provide greater concentration and/or focus of radiation along a central portion thereof, as compared to a peripheral portion thereof, a RA element is preferably arranged to enable selective attenuation or blocking of radiation transmission along a central portion thereof while a peripheral of such RA element is not substantially attenuated (i.e., in a manner opposite to a camera-type mechanical shutter, which is arranged to open from a central point outward, and then close toward the central point). Preferably, individual segments of a RA element exhibit rapid response in response to generation of an activation or deactivation signal, such as within one second, within 0.5 seconds, within 0.1 second, or within 0.02 seconds. In certain embodiments, a RA element is desirably free of moving parts (e.g., free of any mechanical actuator) to minimize mechanical failure modes.

In one embodiment, a RA element includes a liquid crystal ("LC") panel having multiple addressable pixels that may be independently operated via electrical actuation signals to enable transmission or attenuation of light. Preferably, an LC panel enables transmission of at least 90% of incident radiation of a desired spectrum when the LC material is in an optically transmissive state. LC material in such LC panel is preferably selected to withstand high temperature use. LC material that in an activated state is substantially reflective, or exhibits greater reflection than absorption, may be used to reduce heat absorption. One or more filters (e.g., polarizing filters, bandpass filters, etc.) may be used to reduce thermal loading of LC material. A monochromatic (rather than multicolor) LC panel may be used to reduce cost. Pixel size and density may be selected as desirable to optimize any of cost and performance. A LC-based RA element may be provided in any desirable size and may include any desirable number of pixels. In various embodiments, the number of pixels of a RA element may be selected to be equal to or greater than any of the following thresholds: 4, 16, 25, 64, 100, 225, 400, 900, 1600, 2500, $1 \times 10^4$, and $1 \times 10^5$, and $1 \times 10^6$. In various embodiments, pixel density for a RA element may be selected to be equal to or greater than any of the following separate thresholds in units of pixels/cm$^2$: 0.1; 0.25; 0.5; 1; 5; 10; 50; 100; 500; and 1000. Refresh rate of a LC-based RA element may be selected to be equal to or greater than any of the following separate thresholds in units of cycles/second: 1; 5; 10; 20; 60; and 120.

In another embodiment, a RA element includes at least one first diffraction grating arranged to move (e.g., rotate) relative to at least one second diffraction grating, with a first and second diffraction grating arranged to block transmission of radiation when superimposed at a particular relative orientation (e.g., with the first grating rotated ninety degrees relative to the second grating).

In another embodiment, a RA element includes an array of independently actuatable micromirrors (e.g., as embodied in a semiconductor-based digital micromirror device such as digital light processing (DLP) apparatus). In another embodiment, a RA element includes a plurality of independently positionable light blocking solid elements (e.g., tiltable louvers or louver segments, such as may be actuated by magnetic or other means), that may not necessarily embody mirrored or reflective surfaces.

In another embodiment, a RA element includes multiple fluid channels arranged to contain a controllable flow of a first fluid arranged to attenuate transmission of radiation, and a flow of a second fluid arranged to enable substantial transmission of radiation, with the second fluid arranged to selectively flush the first fluid from at least one channel. The first and second fluids may be immiscible to facilitate their separation and re-use.

Use of a RA element in a concentrated solar system as described herein runs counter to conventional wisdom since even in a transmissive (e.g., unactivated) state, a RA element may tend to reduce the amount of radiation available for transmission to a PV cell. Preferably, a RA element enables transmission of at least 90% of incident radiation (or loss of no more than 10% in a transmissive state). In spite of the potential loss of available radiation, the benefits of systems as described herein are substantial. Electric generation from a given PV cell or panel may be enhanced by permitting use of a high concentration factor in low- to moderate illumination conditions, when such high concentration factor might otherwise be excessive during high illumination conditions. Highly concentrated solar systems with fixed concentration factors may be deployed in a variety of latitudes, while using the RA element to attenuate radiation when necessary to prevent one or more PV cells from (1) overheating, and (2) exceeding their maximum power conversion points. Useful life of a PV cell may be extended by avoiding overheat conditions. Radiation and thermal loading across the surface of a PV cell may be equalized at different times of day despite variations in concentration provided by a concentrating element due to variation in angle of incident radiation and/or optical limitations of such a concentrating element. Passive and/or active thermal exchange (e.g., cooling) systems may be avoided, or if provided, may be reduced in capacity, thereby minimizing capital and/or maintenance costs. A concentrated solar system having a selectively controllable RA element may be optionally coupled to a thermal energy utilization apparatus, and selectively enable generation of excess thermal energy at a time when the thermal energy utilization apparatus is suited to receive such energy.

Various types of solar concentrating elements may be used with systems according to the present invention. Optical elements of various types may be used. One type includes optical lenses—such as Fresnel lenses, which are capable of producing high concentration factors in low thicknesses and exhibit reasonably uniform imaging characteristics at a reasonable cost. Mirrors and at least partially reflective surfaces of various shapes may also be used to facilitate solar concentration. Any desired type, shape, and positioning of one or more solar concentrating element(s) may be provided.

In one embodiment, a solar concentrating element may be integrated with a radiation attenuating (RA) element, such as to reduce material utilization, decrease cost, and reduce thickness. For example, a RA element may be provided with liquid crystal (LC) material sandwiched between layers of optically transmissive material such as glass or an optically transmissive polymer. The lower surface of such RA element (e.g., bounding such LC material) may constitute a lens, such as a Fresnel lens.

FIG. 1 is a side cross-sectional view of a concentrated solar PV system 100 according to a first embodiment, the system 100 including a radiation attenuating (RA) element 101, a first concentrating element 105, a second concentrating element 106, and a PV panel 111 arranged within or affixed to a housing or support structure 109. Gaps 102, 104, 108 may be optionally provided between any of the RA element 101, concentrating elements 105-106, and the PV panel 111. Such gaps 102, 104, 108 are preferably sealed, and may be evacuated or contain inert gas. One or more incident radiation sensors 119, such as may be used to sense intensity and/or direction of incident radiation, may be affixed to the housing 109 or disposed proximate to the system 100. At least one sensor, more preferably a plurality of sensors 113A-113E (e.g., arranged in a grid), is disposed in sensory communication with the PV panel 110, such as along a major surface (either front 111 or back 112) thereof. Such sensors 113A-113E may be used to sense one or more conditions indicative or correlative of temperature of the following: at least one PV cell or portion thereof, power output of at least one PV cell (e.g., by sensing current and/or voltage), resistance of at least one PV cell, and concentrated radiation available to at least one PV cell or portion thereof. The foregoing items may be generalized as outputs or conditions of PV cells or portions thereof. Sensors 113A-113E may embody temperature sensors, current and/or voltage sensors, resistance sensors, and or radiation sensors such as charge coupled devices. Sensors 113A-113E may be provided in miniaturized (e.g., microscale) form if provided along the front surface 111 of the PV panel 110 to minimize reduction of concentrated radiation available to the front surface 111.

In operation of the system 100, an incident radiation beam 115 may be transmitted through the RA element 101, concentrated by the first concentrating element 105 to generate a lightly concentrated beam 116, and concentrated by the second concentrating element 106 to generate a highly concentrated beam 117 that is supplied to the front surface 111 of the PV panel 110. Transmission of radiation through discrete portions of the RA element 101 may be selectively modulated in response to signals generated by the sensors 113A-113B, such as to avoid exceeding the maximum power conversion point of, and/or overheating any portion of, the PV cell 110. Correspondence or between the individual segments of the RA element 101 and portions or segments of the PV panel 110 may be established or mapped with respect to time, such as by using signals from the incident radiation sensor 119 indicative or correlative of incident radiation direction.

In certain embodiments, more than one radiation attenuating element may be provided. Primary and secondary RA elements may be provided in series. In one embodiment, primary and secondary RA elements are redundant and each embody addressable portions, with the secondary RA element optionally arranged for placement into automatic operation upon sensing of a failure or malfunction of the first RA element. In another embodiment, a secondary RA element functions exhibits lower radiation transmission loss in an unactivated state but has more limited controllability, and functions as a failsafe device in case of failure of the first RA element. In such an embodiment, the secondary RA element may constitute a movable radiation blocking element (e.g., a closeable shutter, a moveable diffraction grating arranged to move (e.g., rotate) relative to a fixed diffraction grating, or the like), arranged to block a substantial portion or the entirety of incident radiation available for delivery to a PV panel.

Figures 2A, 2B, 2C:
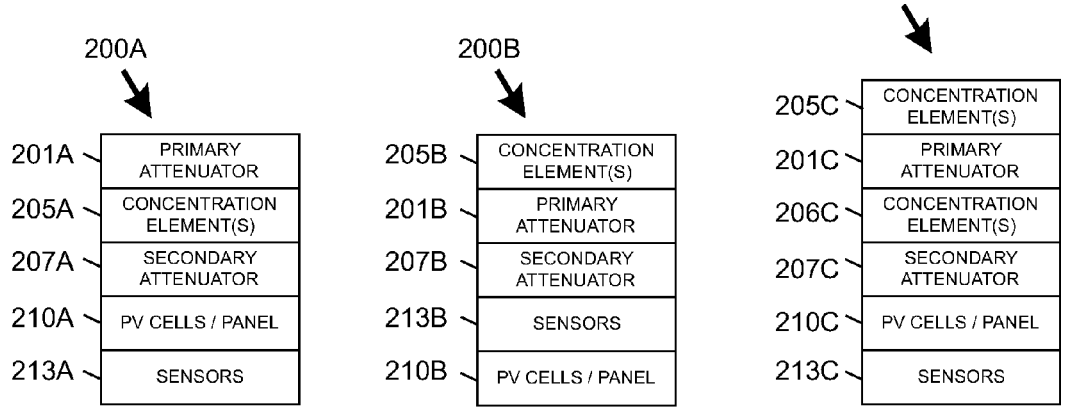
FIGS. 2A-2C embody schematics showing relative positions of concentrated solar PV systems each including at least one radiation attenuating element, according to further embodiments.

Any desired number and relative positioning arrangement of concentrating elements and attenuating elements may be provided. Various exemplary options are schematically illustrated in FIGS. 2A-2C. In FIG. 2A, a concentrated solar system 200A includes a primary RA element 201A overlying one or more concentrating elements 205A, overlying a secondary RA element 207A, which is disposed over a PV panel 210A having sensors 213A disposed along a rear surface thereof. In FIG. 2B, a concentrated solar system 200B includes one or more concentrating elements 205B overlying a primary RA element 201B, overlying a secondary RA element 207B, which is disposed over a PV panel 210B having sensors 213B disposed along a front surface thereof. In FIG. 2C, a concentrated solar system 205C includes one or more concentrating elements 205C overlying a primary RA element 201C, overlying a further one or more concentrating elements 206C, overlying secondary RA element 207C, which is disposed over a PV panel 210C having sensors 213C disposed along a rear surface thereof. If a RA element has a limited temperature operating range, then may be desirable to position such RA element above any radiation concentrating element to reduce risk of overheating the RA element.

Figure 3:
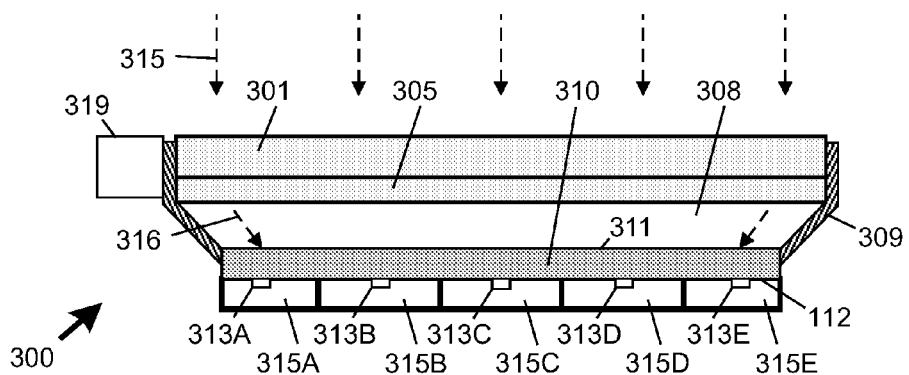
FIG. 3 is a side cross-sectional view of a concentrated solar PV system including a radiation attenuating element and thermal exchange fluid channels, according to another embodiment.

In another embodiment, a concentrated solar system includes at least one RA element and thermal exchange channels to permit convective heat transfer, such as to provide active cooling capability. Referring to FIG. 3, a concentrated solar system 300 includes a RA element 301 arranged over and integrated with a concentrating element 305, with the concentrating element 305 overlying a gap 308 and a PV panel 310. One or more incident radiation sensors 319, such as may be used to sense intensity and/or direction of incident radiation, may be provided. A plurality of sensors 113A-113E (e.g., arranged in a grid, and adapted to sense at least one of temperature, current, voltage, resistance, and concentrated radiation), is in sensory communication with the PV panel 310, such as along a front surface 311 or (as illustrated) a back surface 312 thereof. Any suitable number of thermal exchange channels 315A-315E may be arranged in thermal communication with the PV panel 311, such as to enable removal of excess heat by conductive heat transfer to a thermal exchange fluid arranged to flow within the channels 315A-315E. Such thermal exchange fluid may be provided to an external heat exchanger (not shown) for dissipation or any desired use.

In operation of the system 300, an incident radiation beam 315 may be transmitted through the RA element 301, concentrated by the concentrating element 305 to generate a concentrated beam 316, and supplied to the front surface 311 of the PV panel 310. The RA element 301 may stay in an transmissive (e.g., unactivated) while thermal exchange fluid flowable through the channels 315A-315E is able to maintain the PV cell at or below its maximum power conversion point, and/or to maintain each portion of the PV cell at or below a predefined temperature limit. If, however, the thermal exchange fluid should be unable to maintain such conditions, or a fluid-based thermal exchange subsystem should be unavailable, then transmission of radiation through discrete portions of the RA element 301 may be selectively modulated in response to signals generated by the sensors 313A-313B, in order to avoid exceeding the maximum power conversion point of, and/or overheating any portion of, the PV cell 310.

Figure 4:
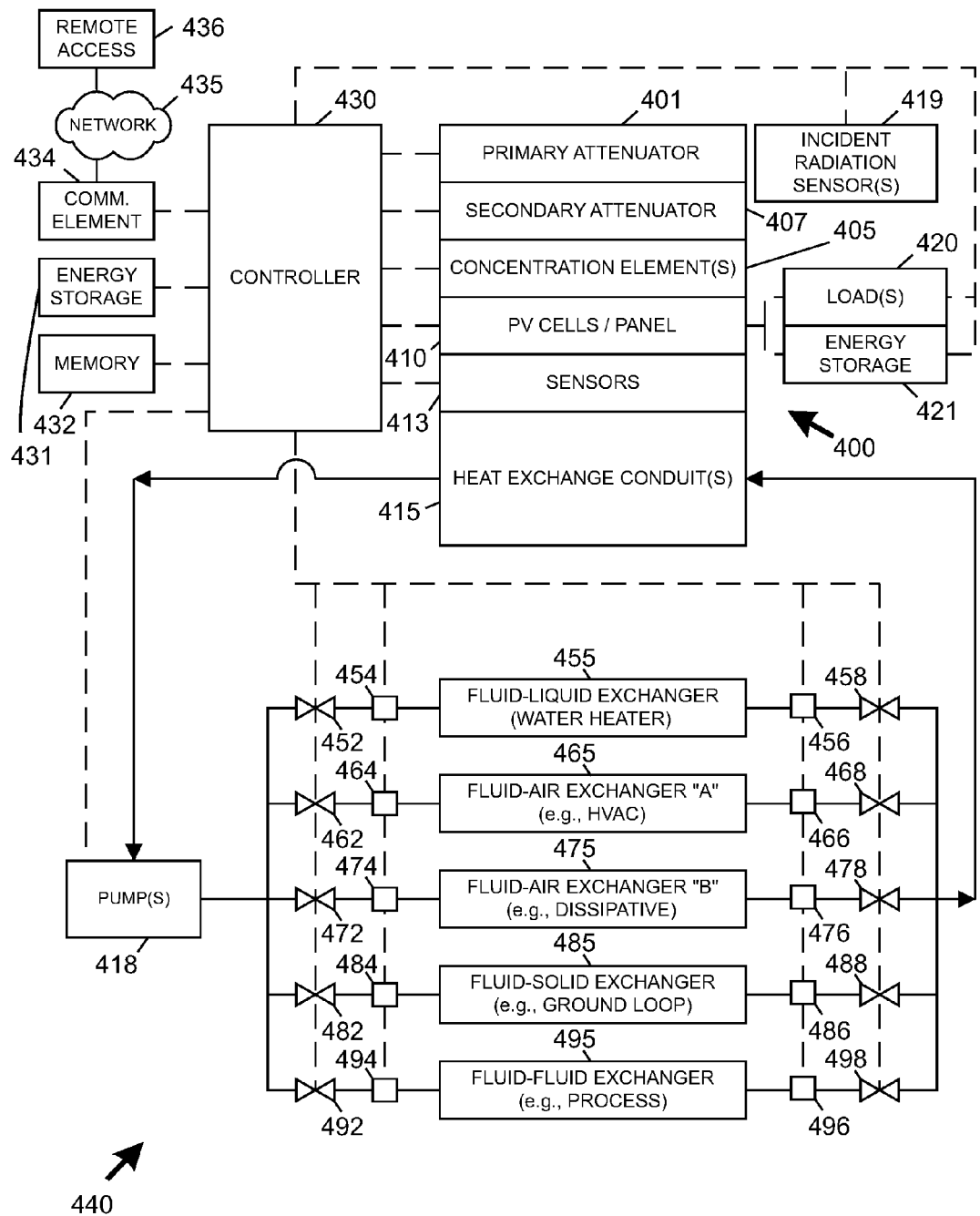
FIG. 4 is a schematic view showing interconnections between various components of a solar energy utilization system including a concentrated solar PV apparatus with at least one radiation attenuating element, according to a further embodiment.

FIG. 4 illustrates various components of a solar energy utilization system 440 including a controller 430 and a concentrated solar PV apparatus 400 having at least one (e.g., primary) RA attenuating element 401, according to a further embodiment of the present invention. The concentrated solar PV apparatus includes a primary RA element 401, an optional secondary RA element 407, at least one radiation concentration element 405, at least one PV panel (or plurality of PV cells) 410, a plurality of sensors 413 (e.g., adapted to sense at least one of temperature, current, voltage, resistance, and concentrated radiation), and at least one heat exchange conduit 415 in thermal communication (whether direct or indirect—such as via intermediate fins, heatpipes, or similar thermal exchange elements) with the PV panel 410. One or more incident radiation sensors 419 may be provided to sense intensity and/or direction of incident radiation. Output of the PV panel 410 may be provided to a load 420 optionally including a primary energy storage element 421 (e.g., one or more batteries).

Thermal exchange fluid may be driven by one or more pumps 418 to flow through the at least one heat exchange conduit 415 and any one or more of various dissipative or heat utilizing elements 455, 465, 475, 485, 495, each having associated isolation or modulation valves 452, 458, 462, 468, 472, 478, 482, 488, 492, 488 and associated (e.g., temperature and/or flow rate) sensors 454, 456, 464, 466, 474, 476, 484, 486, 494, 496. The first heat utilizing element 455 includes a fluid-liquid exchanger, such as a water heater. The second heat utilizing element 465 includes a fluid-air exchanger, such as an air heating (e.g., HVAC or clothes drying) system. The third heat utilizing element 475 includes a fluid-air or fluid-liquid exchanger, such as to dissipate heat to surrounding air or a body of water (e.g. a river). The fourth heat utilizing element 485 includes a fluid-solid exchanger, such as a buried ground loop exchanger to dissipate heat to the ground. The fifth heat utilizing element 495 includes a fluid-fluid or fluid-solid exchanger for transferring heat to a heat-utilizing (e.g., industrial or residential) process, such as an industrial process apparatus. In one embodiment, the heat utilizing process includes pre-heating of a fluid useful for secondary electric power generation—such as a steam turbine or heat engine that may be optionally driven by a concentrated solar thermal system (not shown). Signals from the sensors 454, 456, 464, 466, 474, 476, 484, 486, 494, 496, or optional additional sensors (not shown) arranged to sense ambient conditions associated with any of the heat utilizing elements 455, 465, 475, 485, 495, may provided to the controller 430 and used to determine availability of the heat utilizing elements 455, 465, 475, 485, 495 to receive thermal energy generated by the concentrated solar PV apparatus 400. The controller 430 then take appropriate steps to activate the pump(s) 418 and any one or more of the heat utilizing elements 455, 465, 475, 485, 495, and/or activate the primary RA element 401 and/or secondary RA element 407 of the concentrated solar PV system 400.

The controller 430 may be provided in communication with any element of the solar PV apparatus 400, the incident radiation sensor 419, load 420, primary energy storage element 421, a memory 432, a secondary energy storage element 431 (provided to supply backup power to the controller 430 and various elements of the concentrated PV solar apparatus 400, including the RA element(s) 401, 407), and a communication element 434 (e.g., wired or wireless) arranged to communicate with a remote access site 436 via a network 435. Control information, operational status, alarm information, and/or maintenance information relating to the system 440 may be available to the remote access site 436. The controller 430 functions to receive various sensory inputs (e.g., from sensors 413 and 419) and responsively control the primary RA element 401 and secondary RA element 407. As the angle of the incident radiation constantly varies with respect to time (e.g., with respect to hour and season/time of year), controllable portions of a RA element (e.g., RA element 401) are subject to interact with (i.e., subject to operating relationship with) different portions of a PV panel 410 with respect to time. Such interaction between portions of a RA element and portions of the PV panel may be predictively mapped or correlated, mapped or correlated via use of one or more incident light radiation sensors 419, and/or mapped or correlated using empirical information (e.g., generated by measuring, and preferably storing, PV panel response to RA activation with respect to time), and such mapping information may be used to control operation of the RA element(s) 401, 407. Predictive mapping may be generated (e.g., at the controller 430 or the remote access site 436) using latitude or global positioning coordinates of the solar PV apparatus 400 (e.g., using a GPS sensor (not shown) associatable with the apparatus 400), angular positioning information for the solar PV apparatus 400 (e.g., using one or more angular positioning sensors (not shown) associatable with the apparatus 400), and optical characteristics of the concentrating element(s) 405. If mapping information is generated or stored at the remote access site 436, then it may be periodically supplied to the controller 430 using the communication element 434 and network 435. Alternatively, mapping information may be calculated on demand by the controller 430 (e.g., using one or more signals indicative or correlative of radiation direction received from at least one incident radiation sensor 419) and/or stored in the memory 432. Mapping information may be stored in any desirable form, such as one or more time-dependent formulas, and/or as a relational database or lookup table including mapping information as a function of date and/or time.

In one embodiment, a method utilizing a system as disclosed herein includes mapping or correlating time-dependent operating relationships between (A) at least some controllable segments or pixels of an array of independently controllable segments or pixels and (B) at least some portions of a photoelectric element having a plurality of portions; and adjusting or controlling operation of a RA element responsive to the mapping or correlating step.

As useful to explain the concept of mapping between a RA element and a PV panel (i.e., in connection with FIGS. 6A-6C and 7A-7B below), FIG. 5 is a schematic providing row and column addresses (including columns A to D and rows 1 to 4) for sixteen segments of a RA element and a PV panel.

FIGS. 6A-6C provide perspective schematic views of portions of a concentrated solar PV system 600 according to one embodiment, showing relative correspondence or mapping between segments 601 of a RA element 601 and segments of a PV panel for incident radiation at different angles corresponding to different periods of time. (To simplify presentation, element numbers are not provided for every segment of the RA element 601 between opposing corner segments $601_{A1}$ to $601_{D4}$, or for every segment of the PV panel 610 between opposing corner segments $610_{A1}$ and $610_{D4}$, with the understanding that each unlabeled segment may be referenced with subscripts according to the row and column addresses provided in FIG. 5). In FIG. 6A, a beam of incident radiation 615A is supplied generally downward to the RA element 601 at an angle sloping to the right. Four center segments or pixels (namely, segments $601_{B2}$, $601_{C2}$, $601_{B3}$, $601_{c3}$) of the RA element 601 are activated to attenuate or block transmission of incident radiation, thus causing four (groupwise shifted right of center) segments of the PV panel 610 (i.e., $610_{C2}$, $610_{D2}$, $610_{C3}$, $610_{D3}$) to be 'shadowed' or substantially devoid of concentrated solar radiation transmitted through the RA element 601. In FIG. 6B, a beam of incident radiation 615A is supplied straight downward to the RA element 601. Four center segments or pixels (i.e., segments $601_{B2}$, $601_{C2}$, $601_{B3}$, $601_{c3}$) of the RA element 601 are activated to attenuate or block transmission of incident radiation, thus causing the corresponding four center segments of the PV panel 610 (namely, segments $610_{B2}$, $610_{C2}$, $610_{B3}$, $610_{c3}$) to be 'shadowed' or substantially devoid of concentrated solar radiation transmitted through the RA element 601. In FIG. 6C, a beam of incident radiation 615A is supplied generally downward to the RA element 601 at an angle sloping to the left. Four center segments or pixels (i.e., $601_{B2}$, $601_{C2}$, $601_{B3}$, $601_{c3}$) of the RA element 601 are activated to attenuate or block transmission of incident radiation, thus causing four (groupwise shifted left of center) segments of the PV panel 610 (namely, segments $610_{A2}$, $610_{B2}$, $610_{A3}$, $610_{B3}$) to be 'shadowed' or substantially devoid of concentrated solar radiation transmitted through the RA element 601. Such information may be correlated with signals received from at least one incident radiation sensor 419 (e.g., providing signals indicative or correlative of direction of incident radiation), and/or stored with respect to date and time, as information indicative of time-dependent mapping between discrete segments of the RA element 601 and the PV panel 610.

In one embodiment, individual segments of a RA element of a concentrated solar PV system may be rapidly activated and deactivated to maintain a desired average level of radiation transmission, such as may be useful to maintain operation of individual segments of a PV panel close to a maximum power conversion point. FIGS. 7A-7B provide perspective views of a concentrated solar PV system according to one embodiment, each showing a RA element 701, a concentrating element 705, and a PV panel 710. FIGS. 7A-7B show application of alternating (i.e., inverted checkerboard) attenuation patterns to the RA element 701, in which non-adjacent segments of the RA element 701 are alternately activated and deactivated (e.g., segments $701_{A1}$ and $701_{D4}$ are activated in FIG. 7A and deactivated in FIG. 7B) to allow transmission of roughly 50% of incident radiation (minus any transmission loss associated with the RA element 701) to the PV panel 710 including segments $710_{A1}$, $710_{D4}$. Greater fractions of incident radiation may be transmitted by deactivating all segments of the RA element for any desired period between initiation of one or both patterns shown in FIGS. 7A-7D. Refresh rates may be selected to be equal to or greater than 1, 5, 10, 20, 60, or 120 cycles/second.

In one embodiment, a concentrated solar PV system with controllable RA element may include a solar tracking mechanism arranged to adjust position of at least one element of the PV system. FIG. 8 illustrates such a system 800 including a controllable RA element 801 overlying a concentrating element 805, disposed over a gap 808 and a PV panel 810 arranged within or affixed to a housing or support structure 809. One or more incident radiation sensors 819 (such as may be used to sense intensity and/or direction of incident radiation) and one or more angular position sensors 817, may be affixed to the housing 809 or disposed proximate to the system 800. Multiple sensors 813A-813E (e.g., arranged in a grid, and adapted to sense at least one of temperature, current, voltage, resistance, and concentrated radiation), are in sensory communication with the PV panel 810, such as along a front surface 811 or back surface 812 thereof. One or more tracking mechanisms 818A, 818B may be coupled to at least one element of the PV system 800, such as the housing 809, to enable the at least one element of the PV system to track the sun.

In operation of the system 800, an incident radiation beam 815 may be transmitted through the RA element 801, and concentrated by the concentrating element 805 to generate a concentrated beam 816 that is supplied to the front surface 811 of the PV panel 810. The at least one tracking mechanism 818A, 818B is used to move at least one element of the system 800 to follow movement of the sun with respect to time. Transmission of radiation through discrete portions of the RA element 801 may be selectively modulated in response to signals generated by the sensors 813A-813B, such as to avoid exceeding the maximum power conversion point of, and/or overheating any portion of, the PV cell 810.

FIG. 9 illustrates a concentrated PV solar system 900 according to another embodiment, including a non-planar RA element 901. The RA element 901 is disposed over a first concentrating element 905 and an optional second concentrating element 906 arranged to transmit concentrated radiation to a PV panel 910 mounted within or on a support structure 909. Gaps 902, 904, 906 may be optionally provided between the RA element 901, the concentrating elements 905, 906, and the PV panel 910. Multiple sensors 913A-913E (e.g., adapted to sense at least one of temperature, current, voltage, resistance, and concentrated radiation), are arranged in sensory communication with the PV panel 910, such as along a front surface 911 or back surface 912 thereof. The non-planar RA element 901 and concentrating elements 905, 906 are preferably shaped and arranged to cause incident radiation received from a wide range of incident angles (including shallow angles) to be concentrated and delivered to the PV panel, so as to maximize electric generation during periods early and late in the day. The concentrating element(s) 905, 906 may be provided with intentional variation in concentration factor from a first position along the edge (e.g., with a high concentration factor to highly concentrate lower intensity incident radiation delivered at shallow incident angles corresponding to periods early or late in the day) to a second position nearer to the center (e.g., with a lower concentration factor more appropriate for concentration of high intensity incident radiation delivered during mid-day periods). Such variation in concentration factor may be provided with a concentrating lenses formed of thicker and/or with higher index of refraction materials along the edges, as compared to thinner and/or lower index of refraction materials along the center. The non-planar RA element 901 may include an array of liquid crystal elements disposed between layers of glass or polymeric materials. Rigid polymeric materials may be advantageously formed in curved (e.g., hemispherical) shapes using techniques such as casting and vacuum thermoforming (involving application of heat to soften a sheet of polymeric material, followed by application of subatmospheric pressure to draw the softened sheet against a curved die, followed by cooling and separation of a curved solid from the die). Circuit traces and liquid crystal material may be provided between hemispherical sheets of such material. In one embodiment, a composite non-planar RA element 901 may be fabricated by joining of multiple planar RA portions (e.g., using adhesives, thermal bonding, and/or preferably optically transmissive supporting elements) to form an approximately hemispherical geometric shape, such as a connected polyhedron (e.g., half of a truncated icosahedron). Planar RA portions forming the composite non-planar RA element 901 may be produced according to conventional liquid crystal panel fabrication techniques.

In operation of the system 900, an incident radiation beam (not shown) may be transmitted through the RA element 901, concentrated by the first and second concentrating elements 905, 906, and supplied to the front surface 911 of the PV panel 910. Transmission of radiation through discrete portions of the RA element 901 may be selectively modulated in response to signals generated by the sensors 913A-913B, such as to avoid exceeding the maximum power conversion point of, and/or overheating any portion of, the PV cell 110. Correspondence or between the individual segments of the RA element 901 and portions of the PV panel 910 may be established or mapped with respect to time, such as by using signals from the incident radiation sensors 919A-919B indicative or correlative of incident radiation direction.

It is to be appreciated that elements described in connection with individual embodiments provided herein may be combined with other embodiments to provide additional advantage. For example, any of the embodiments described herein may be modified to include elements such as: secondary RA element; thermal exchange channels communicatively coupled between a PV panel and at least one external heat exchanger; integrated RA element and concentrating element; tracking mechanism; and/or non-planar RA element and non-planar concentrating element(s).

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various elements and steps disclosed separately herein may be aggregated in different combinations and permutations to provide additional advantage(s) as may be desirable for a particular end use or application. Any of various elements or features recited herein are contemplated for use in combination with other features or elements disclosed herein, unless specified to the contrary. Correspondingly, the invention as hereinafter claimed is intended to be broadly construed and interpreted, as including all such variations, modifications and alternative embodiments, within its spirit and scope.

What is claimed is:

1. A solar photovoltaic electric power generating system comprising:
    a solar concentrating element arranged to receive and concentrate an incident solar radiation beam to generate a concentrated solar radiation beam;
    a photovoltaic element arranged to receive at least a portion of the concentrated solar radiation beam;
    a radiation attenuating element comprising an array of independently controllable segments or pixels arranged to selectively attenuate the incident solar radiation beam or the concentrated solar radiation beam to affect an amount of radiation in the at least a portion of the concentrated solar radiation beam transmitted to at least one portion of the photovoltaic element;
    at least one sensor arranged to generate at least one output signal; and
    a controller adapted to control the array of independently controllable segments or pixels responsive to the at least one output signal;
    wherein the system comprises one of the following features (i) or (ii):
        (i) the at least one output signal is correlative of at least one of (A) temperature of at least one portion of the photovoltaic element, or (B) current of at least one portion of the photovoltaic element; or
        (ii) the photovoltaic element comprises a plurality of portions, the at least one sensor comprises a plurality of sensors wherein each portion of the plurality of portions has an associated sensor of the plurality of sensors that is arranged to generate an output signal correlative of output power of the portion, and the controller is arranged to maintain each portion of the photovoltaic element at or below a maximum power conversion point or at or below a maximum temperature threshold.

2. A system according to claim 1, wherein the at least one output signal is correlative of at least one of (A) temperature of at least one portion of the photovoltaic element, or (B) current of at least one portion of the photovoltaic element.

3. A system according to claim 1, wherein the photovoltaic element comprises a plurality of portions, the at least one sensor comprises a plurality of sensors wherein each portion of the plurality of portions has an associated sensor of the plurality of sensors that is arranged to generate an output signal correlative of output power of the portion, and the controller is arranged to maintain each portion of the photovoltaic element at or below a maximum power conversion point or at or below a maximum temperature threshold.

4. A system according to claim 1, wherein the radiation attenuating element comprises an array of addressable liquid crystal attenuating elements.

5. A system according to claim 1, further comprising at least one sensor arranged to generate a direction signal correlative of direction of incident solar radiation, wherein the array of independently controllable segments or pixels is further controlled responsive to the direction signal.

6. A system according to claim 1, wherein the radiation attenuating element is operable with an electrical input signal and is free of any mechanical actuator.

7. A system according to claim 1, wherein the solar concentrating element is light-transmissive, and wherein at least a portion of at least one of (a) the radiation attenuating element or (b) the solar concentrating element, is curved or angled in a non-planar shape.

8. A system according to claim 1, further comprising at least one thermal exchange fluid channel in thermal communication with the photovoltaic element.

9. A solar photovoltaic electric power generating system comprising:
    a solar concentrating element arranged to receive and concentrate an incident solar radiation beam to generate a concentrated solar radiation beam;
    a photovoltaic element arranged to receive at least a portion of the concentrated solar radiation beam;
    at least one sensor arranged to generate at least one output signal correlative of at least one of (A) temperature of at least one portion of the photovoltaic element, or (B) current of at least one portion of the photovoltaic element; and
    a radiation attenuating element arranged to selectively attenuate the incident solar radiation beam or the concentrated solar radiation beam to affect an amount of radiation in the at least a portion of the concentrated solar radiation beam transmitted to at least a portion of the photovoltaic element responsive to the at least one output signal.

10. A system according to claim 9, wherein the radiation attenuating element comprises an array of addressable segments or pixels.

11. A system according to claim 9, wherein the photovoltaic element comprises a plurality of portions, the at least one sensor comprises a plurality of sensors, and each portion of the plurality of portions has at least one associated sensor of the plurality of sensors.

12. A system according to claim 9, wherein the radiation attenuating element comprises an array of addressable liquid crystal attenuating elements.

13. A system according to claim 10, further comprising at least one sensor arranged to generate a direction signal correlative of direction of incident solar radiation, wherein the array of addressable segments or pixels is controlled responsive to the direction signal.

14. A system according to claim 9, wherein the radiation attenuating element is operable with an electrical input signal and is free of any mechanical actuator.

15. A system according to claim 9, wherein the solar concentrating element is light-transmissive, and wherein at least a portion of at least one of (a) the radiation attenuating element or (b) the solar concentrating element, is curved or angled in a non-planar shape.

16. A system according to claim 9, adapted to maintain the photovoltaic element at or below a maximum power conversion point.

17. A system according to claim 9, further comprising at least one thermal exchange fluid channel in thermal communication with the photovoltaic element.

18. An electric power generating method utilizing a solar concentrating element arranged to receive and concentrate an incident solar radiation beam to generate a concentrated solar radiation beam, a photovoltaic element arranged to receive at least a portion of the concentrated solar radiation beam, and a radiation attenuating element arranged to selectively attenuate the incident solar radiation beam or the concentrated solar radiation beam to affect an amount of radiation in the at least a portion of the concentrated solar radiation beam transmitted to at least one portion of the photovoltaic element, the method comprising:

sensing and generating at least one output signal indicative of at least one of (A) temperature of at least one portion of the photovoltaic element, or (B) current of at least one portion of the photovoltaic element; and selectively attenuating the incident solar radiation beam or the concentrated solar radiation beam to affect an amount of radiation in the at least a portion of the concentrated solar radiation beam transmitted to the at least a portion of the photovoltaic element responsive to the at least one output signal.

19. An electric power generating method according to claim 18, wherein:

the radiation attenuating element comprises an array of independently controllable segments or pixels;

the photovoltaic element comprises a plurality of portions, each portion of the plurality of portions has at least one associated sensor arranged to generate the at least one output signal correlative of at least one of (A) temperature of at least one portion of the photovoltaic element, or (B) current of at least one portion of the photovoltaic element; and the method further comprises controlling the array of independently controllable segments or pixels responsive to the at least one output signal.

20. An electric power generating method according to claim 19, wherein said controlling the array of independently controllable segments or pixels responsive to the at least one output signal is performed to maintain each portion of the photovoltaic element at at least one of the following conditions: (a) at or below a maximum power conversion point, or (b) at or below a maximum temperature threshold.

* * * * *